United States Patent
Snaddon et al.

(10) Patent No.: US 7,106,790 B2
(45) Date of Patent: Sep. 12, 2006

(54) METHOD AND APPARATUS FOR MEASURING A SIGNAL SPECTRUM

(75) Inventors: Stuart Snaddon, Glasgow (GB); Roy Schuller, Edinburgh (GB)

(73) Assignee: Agilent Technologies, Inc., Palo Alto, CA (US)

( * ) Notice: Subject to any disclaimer, the term of this patent is extended or adjusted under 35 U.S.C. 154(b) by 692 days.

(21) Appl. No.: 10/139,466

(22) Filed: May 7, 2002

(65) Prior Publication Data

US 2002/0191686 A1    Dec. 19, 2002

(30) Foreign Application Priority Data

Jun. 18, 2001    (EP) ................................. 01305289

(51) Int. Cl.
 H04B 17/00    (2006.01)
 G01R 23/00    (2006.01)
(52) U.S. Cl. .................................. 375/224; 324/76.19
(58) Field of Classification Search ................. 375/224, 375/225, 227; 324/76.19, 76.22, 76.39, 76.69; 702/66, 69
See application file for complete search history.

(56) References Cited

U.S. PATENT DOCUMENTS 3,916,319 A  * 10/1975  Hawley et al. ........... 455/161.1
5,617,523 A  *  4/1997  Imazu et al. ................ 345/440
6,768,293 B1 *  7/2004  Snaddon et al. ......... 324/76.19
6,853,932 B1 *  2/2005  Wichelman et al. .......... 702/76

FOREIGN PATENT DOCUMENTS

EP    11194145         7/1999
EP    2 343 522 A      5/2000

OTHER PUBLICATIONS

Iwansson, K., Examiner, European Search Report, Application No. EP 01 30 5289, dated Jan. 29, 2002.

* cited by examiner

Primary Examiner—Young T. Tse

(57) ABSTRACT

A spectrum analyzer used for making a spectrum emission mask measurement reorganizes execution of the measurement so that all frequency bands to be measured at the same resolution bandwidth are measured in a single sweep, extending between the extreme frequency limits of those bands, thereby avoiding setup delays involved in specifying successive measurements for each band individually. Portions of each measurement which correspond to frequency bands to be measured at the respective resolution bandwidth of that measurement are extracted, resized as necessary, and assembled into a complete spectrum measurement.

5 Claims, 4 Drawing Sheets

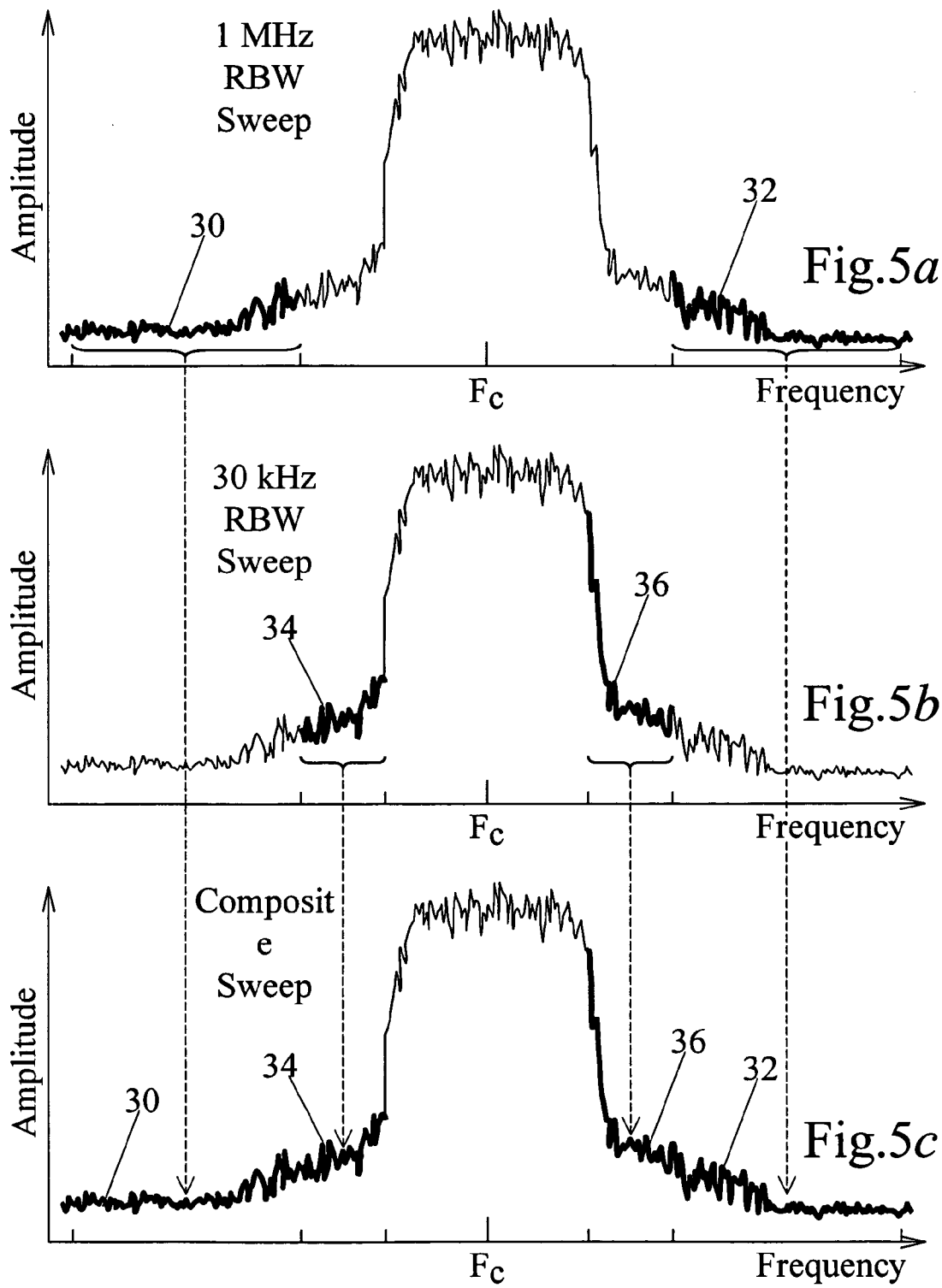

METHOD AND APPARATUS FOR MEASURING A SIGNAL SPECTRUM

TECHNICAL FIELD

This invention relates to methods and apparatus for measuring a signal spectrum, and more particularly to signal spectrum measurements in which signal power levels for different portions of the spectrum are to be measured at different respective resolution bandwidths. The invention is applicable for example to the measurement of out of band emissions of mobile communications devices, such as mobile telephone handsets and base stations.

BACKGROUND ART

The rapidly increasing adoption of mobile communications facilities, such as mobile telephone systems, has led to a growing demand for the associated user devices, such as mobile telephone handsets and other mobile stations (MS), and for the equipment comprising the network infrastructure, such as base stations. Avoidance of out of band emissions from transmitter circuitry in these devices and equipment is important both for the quality of service provided by the devices and for minimising potential interference caused to other users of the system. To this end, it is essential that the out of band emissions of every device are carefully measured by the manufacturer before shipment to ensure the device is compliant with prescribed limits on the strength of such emissions. Equally however, the manufacturers desire that these tests should be accomplished as quickly as possible, to minimise delays they introduce into production timescales.

In the case for example of equipment intended for use in so-called $3^{rd}$ Generation mobile communications systems, using code division multiple access (e.g. W-CDMA and cdma2000 systems), the strength of out of band emissions is compared to a "spectrum emission mask" defining maximum acceptable emissions at various offsets from the intended transmitter carrier frequency. The test is specified in terms of a measurement of the CDMA carrier strength, and measurements of multiple (e.g. 4 or 5) frequency bands offset either side of that carrier frequency (see for example preliminary 3GPP Technical Specifications 25.141 and 34.121). The start and stop frequencies and resolution bandwidth are specified for each offset measurement.

One conventional approach to implementing this test involves using a spectrum analyser to measure each offset frequency band individually. This requires the analyser's settings (start frequency, stop frequency, resolution bandwidth and sweep time) to be set up appropriately for each offset, in accordance with the relevant specification. Each change of settings between successive offset measurements requires a small but finite setup time to complete, to input the required settings into the analyser and to allow the analyser to modify its internal operation accordingly. The large number of changes of setting required for the total number of offsets defined in the specifications results in a large cumulative setup time, and therefore a test which is slow overall.

Another known approach to the spectrum emission mask measurement is to use a vector analyser to measure individually successive segments of each offset frequency band, the frequency range of input signals for a segment being restricted to equal the resolution bandwidth. However, this involves performing a large number of complex Fourier transform computations on time-domain data, to generate the required frequency-domain result. The time required the accomplish these computations is generally unacceptably long for manufacturing test purposes.

It is an object of this invention to reduce overall test time for spectrum emission mask and similar measurements.

DISCLOSURE OF INVENTION

According to one aspect of this invention there is provided a method of measuring a signal spectrum in which signal power levels for different frequency bands in the spectrum are to be measured at different respective resolution bandwidths, comprising the steps of:

identifying extreme start and stop frequencies for overall sections of spectrum to be measured at each resolution bandwidth;

performing a plurality of spectrum measurements, each said measurement extending between respective extreme start and stop frequencies for the respective resolution bandwidth of that measurement;

selecting from each spectrum measurement portions which correspond to frequency bands in the spectrum to be measured at the respective resolution bandwidth of that measurement; and assembling the selected spectrum measurement portions into a complete spectrum measurement.

According to another aspect of this invention there is provided apparatus for measuring a signal spectrum in which signal power levels for different frequency bands in the spectrum are to be measured at different respective resolution bandwidths, comprising:

an identifier for identifying extreme start and stop frequencies for overall sections of spectrum to be measured at each resolution bandwidth;

a spectrum measurer for performing a plurality of spectrum measurements, each said measurement extending between respective extreme start and stop frequencies for the respective resolution bandwidth of that measurement;

a selector for selecting from each spectrum measurement portions which correspond to frequency bands in the spectrum to be measured at the respective resolution bandwidth of that measurement; and an assembler for assembling the selected spectrum measurement portions into a complete spectrum measurement.

BRIEF DESCRIPTION OF DRAWINGS

A method and apparatus in accordance with this invention, for performing spectrum emission mask measurements on mobile communications equipment, will now be described, by way of example, with reference to the accompanying drawings, in which:

FIGS. 5a to 5c illustrate assembly of an emission mask measurement from frequency sweeps at different resolution bandwidths.

BEST MODE FOR CARRYING OUT THE INVENTION, & INDUSTRIAL APPLICABILITY

As noted above, one of the tests applied to mobile communications transmission equipment is intended to ensure it complies with standards specifying maximum permissible out of band emissions. To this end a spectrum emission mask measurement is performed on the equipment, to compare the actual emissions on either side of the intended transmitter channel bandwidth with a mask specifying a maximum level of output power from the equipment as a function of frequency offset from the channel centre frequency.

At relatively large offsets from the channel centre frequency it is feasible and desirable for the maximum strength of out of band emissions to be specified at a very low level, and the resolution bandwidth of the measurement can be set relatively broad (e.g. 1 MHz) without risking interference with the measurement from the signal within the desired channel bandwidth. However, at relatively close offsets to the centre frequency a higher level of out of band emission must be tolerated as a matter of practical engineering design, and a lower resolution bandwidth must be used for the measurement (e.g. 30 kHz) to ensure the desired channel signal does not fall within that bandwidth and disturb the measurement.

Accordingly a spectrum emission mask is typically defined for several pairs of frequency bands offset either side of the intended channel bandwidth, with different frequency spans, resolution bandwidths and maximum permitted power levels for each pair. An example of the frequency bands and associated resolution bandwidths for one spectrum emission mask measurement (specified in 3GPP TS 25.141, subclause 6.5.2, for base station conformance testing) is set out below, where $F_c$ is the channel centre frequency and RBW stands for resolution bandwidth:

$F_c-12.5\pm0.5$ MHz→$F_c-8.0\pm0.5$ MHz (RBW=1 MHz) (i.e. min=$F_c-13.0$ MHz)

$F_c-8.0\pm0.5$ MHz→$F_c-4.0\pm0.5$ MHz (RBW=1 MHz) (i.e. max=$F_c-3.5$ MHz)

$F_c-3.985\pm0.015$ MHz→$F_c-3.515\pm0.015$ MHz (RBW=30 kHz) (i.e. min=$F_c-4.000$ MHz)

$F_c-3.515\pm0.015$ MHz→$F_c-2.715\pm0.015$ MHz (RBW=30 kHz)

$F_c-2.715\pm0.015$ MHz→$F_c-2.515\pm0.015$ MHz (RBW=30 kHz) (i.e. max=$F_c-2.500$ MHz)

$F_c+2.515\pm0.015$ MHz →$F_c+2.715\pm0.015$ MHz (RBW=30 kHz) (i.e. min=$F_c+2.500$ MHz)

$F_c+2.715\pm0.015$ MHz→$F_c+3.515\pm0.015$ MHz (RBW=30 kHz)

$F_c+3.515\pm0.015$ MHz→$F_c+3.985\pm0.015$ MHz (RBW=30 kHz) (i.e. max=$F_c+4.000$ MHz)

$F_c+4.0\pm0.5$ MHz→$F_c+8.0\pm0.5$ MHz (RBW=1 MHz) (i.e. min=$F_c+3.5$ MHz)

$F_c+8.0\pm0.5$ MHz→$F_c+12.5\pm0.5$ MHz (RBW=1 MHz) (i.e. max=$F_c+13.0$ MHz)

Figure 1:
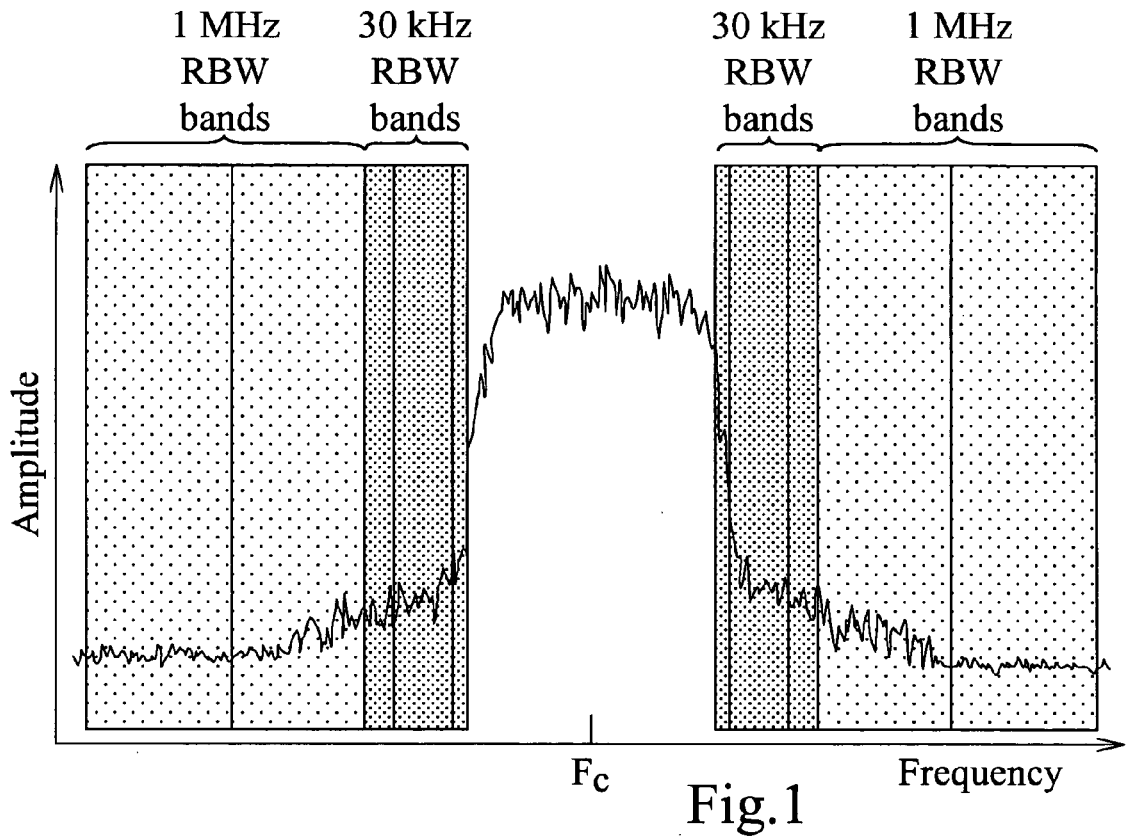
FIG. 1 is a frequency spectrum annotated to illustrate the frequency bands and resolution bandwidths of a spectrum emission mask measurement.

These measurement bands are illustrated with reference to a typical signal spectrum in FIG. 1.

Figure 2:
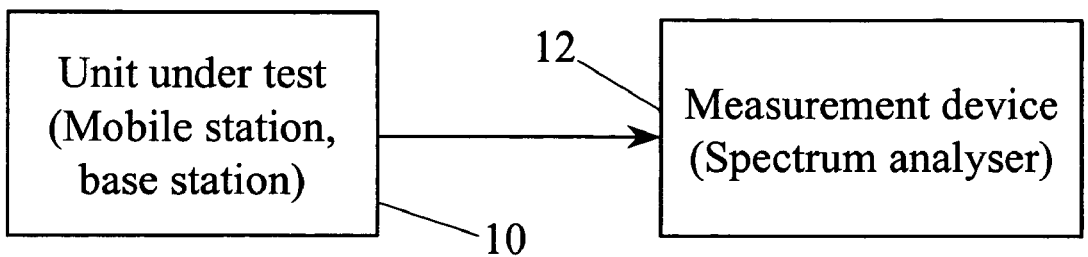
FIG. 2 is a block schematic diagram of a test setup for performing a spectrum emission mask measurement.

Conventional measurements for this spectrum emission mask involve a test setup as shown in FIG. 2, in which a unit under test 10 (such as a mobile telephone handset or a base transceiver station) is coupled via its antenna connector to a measurement device 12, such as a spectrum analyser. The spectrum analyser may conveniently have facilities for storing and automatically performing a sequence of measurements. Specifically the spectrum analyser 12 has the frequency bands (i.e. start and stop frequencies) for the required spectrum emission mask measurement stored in it, together with the respective resolution bandwidth for each band. Then the analyser can be instructed to perform the sequence of measurements, starting with the lowest start frequency and sweeping upwards in frequency until the highest stop frequency is reached. Typically the analyser will itself determine an appropriate sweep time for each measurement, in accordance with the frequency span and resolution bandwidth and the analyser's operating characteristics, to maintain the instrument's calibration. At each intermediate stop frequency the analyser 12 pauses and modifies its settings, including resolution bandwidth, for the next higher frequency band in accordance with the pre-stored values. Each such pause and modification incurs an associated setup time while the circuitry of the spectrum analyser 12 adjusts itself to the new settings. The set of ten frequency bands for the example spectrum emission mask measurement given above would involve nine such pauses and setup times, significantly delaying completion of the measurement.

Figure 3:
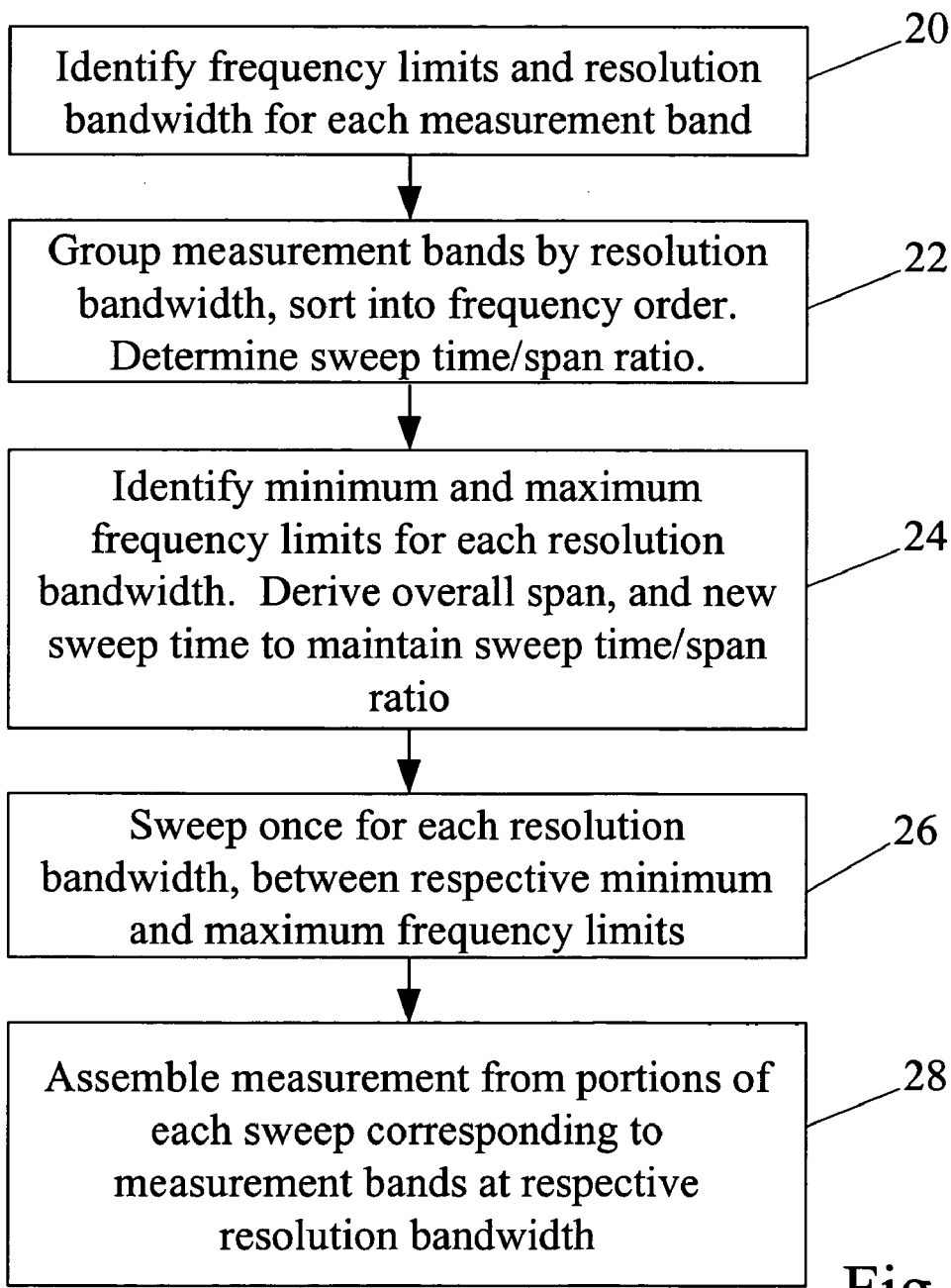
FIG. 3 is a flow chart of an implementation of the present invention, for reducing the time required to perform a spectrum emission mask measurement.

To reduce this delay, the present invention reorganises execution of the measurement using the procedure shown in FIG. 3. This procedure can conveniently be implemented, for example, by means of a programmable processor incorporated in the spectrum analyser 12, and arranged to operate under the control of software program instructions stored in memory in the analyser and defining the steps of the procedure.

Referring to FIG. 3, at step 20 the frequency limits and resolution bandwidth for each frequency band in the overall emission mask measurement are identified, for example by reference to the pre-stored information defining the measurement. At step 22 these measurement frequency bands are grouped together according to resolution bandwidth, and sorted into frequency order (e.g. lowest start frequency to highest start frequency). Thus, for the example emission mask measurement given above, there would be two sorted groups, as follows:

30 kHz RBW $F_c-3.985\pm0.015$ MHz→$F_c-3.515\pm0.015$ MHz (RBW=30 kHz) (i.e. min=$F_c-4.000$ MHz)

$F_c-3.515\pm0.015$ MHz→$F_c-2.715\pm0.015$ MHz (RBW=30 kHz)

$F_c-2.715\pm0.015$ MHz→$F_c-2.515\pm0.015$ MHz (RBW=30 kHz) (i.e. max=$F_c2.500$ MHz)

$F_c+2.515\pm0.015$ MHz→$F_c+2.715\pm0.015$ MHz (RBW=30 kHz) (i.e. min=$F_c+2.500$ MHz)

$F_c+2.715\pm0.015$ MHz→$F_c+3.515\pm0.015$ MHz (RBW=30 kHz)

$F_c+3.515\pm0.015$ MHz→$F_c+3.985\pm0.015$ MHz (RBW=30 kHz) (i.e. max=$F_c+4.000$ MHz)

1 MHz RBW $F_c-12.5\pm0.5$ MHz→$F_c-8.0\pm0.5$ MHz (RBW=1 MHz) (i.e. min=$F_c-13.0$ MHz)

$F_c-8.0\pm0.5$ MHz→$F_c-4.0\pm0.5$ MHz (RBW=1 MHz) (i.e. max=$F_c-3.5$ MHz)

$F_c+4.0\pm0.5$ MHz→$F_c+8.0\pm0.5$ MHz (RBW=1 MHz) (i.e. min=$F_c+3.5$ MHz)

$F_c+8.0\pm0.5$ MHz→$F_c+12.5\pm0.5$ MHz (RBW=1 MHz) (i.e. max=$-F_c+13.0$ MHz)

The optimal sweep time and the ratio of that sweep time to the frequency span are determined for each frequency band, so that a compensated value for this ratio can be determined during the following step. For example, the frequency span for one of the 30 kHz RBW measurements closest to the centre frequency is $F_c-2.715$ MHz to $F_c-2.515$ MHz, that is 200 kHz. If the sweep time for this individual measurement is determined by a particular analyser to be 1 ms, the sweep time/span ratio would be $10^{-3}/(200\times 10^3)$, or $5\times 10^{-9}$.

The procedure then advances to the following step, 24, where the lowest and highest frequency limits for each resolution bandwidth are identified (in the example, these are $F_c-3.985\pm 0.015$ MHz to $F_c+3.985\pm 0.015$ MHz for 30 kHz RBW, and $F_c-12.5\pm 0.5$ MHz to $F_c+12.5\pm 0.5$ MHz for 1 MHz RBW). Then the overall section of the spectrum to be swept is identified, and a compensated sweep time is derived so that the ratio of sweep time to frequency span of that overall section is the same as for the span of the individual frequency bands at the same resolution bandwidth. Preserving the sweep time/span ratio in this way ensures that the statistics of the measurement for the overall section are adequate to provide a reliable measurement and are consistent with the statistics that would be obtained for each frequency band individually. If two or more different compensated sweep times are determined within the same sorted group of frequency bands, the larger or largest sweep time value is used for all measurements in that group.

For example, the overall frequency span for the measurement at 30 kHz RBW can be seen to be $F_c-4$ MHz to $F_c+4$ MHz, that is 8 MHz, and the sweep time/span ratio may have been determined at step 22, as described above, to be $5\times 10^{-9}$. Then the sweep time for the 8 MHz span measurement must be $8\times 10^6 \times 5\times 10^{-9}$, or 40 ms.

Conveniently all the sweeps for different resolution bandwidths can be specified to have the same start and stop frequencies, covering the entire bandwidth of the emission mask measurement, since this avoids the need to perform any re-sizing of measurement samples at step 28 (described below). However, this may not be appropriate if, for example, an individual measurement frequency band is so narrow that the setup delay for that measurement is less than the extra time required to sweep the entire bandwidth of the emission mask measurement instead of the bandwidth of that individual band. In that case, it is likely to be more efficient to sweep the individual measurement band separately, and then re-size the measurement at step 28 (to adjust the data to compensate for the differing frequency ranges represented by measurement samples for different frequency spans).

Figure 4:
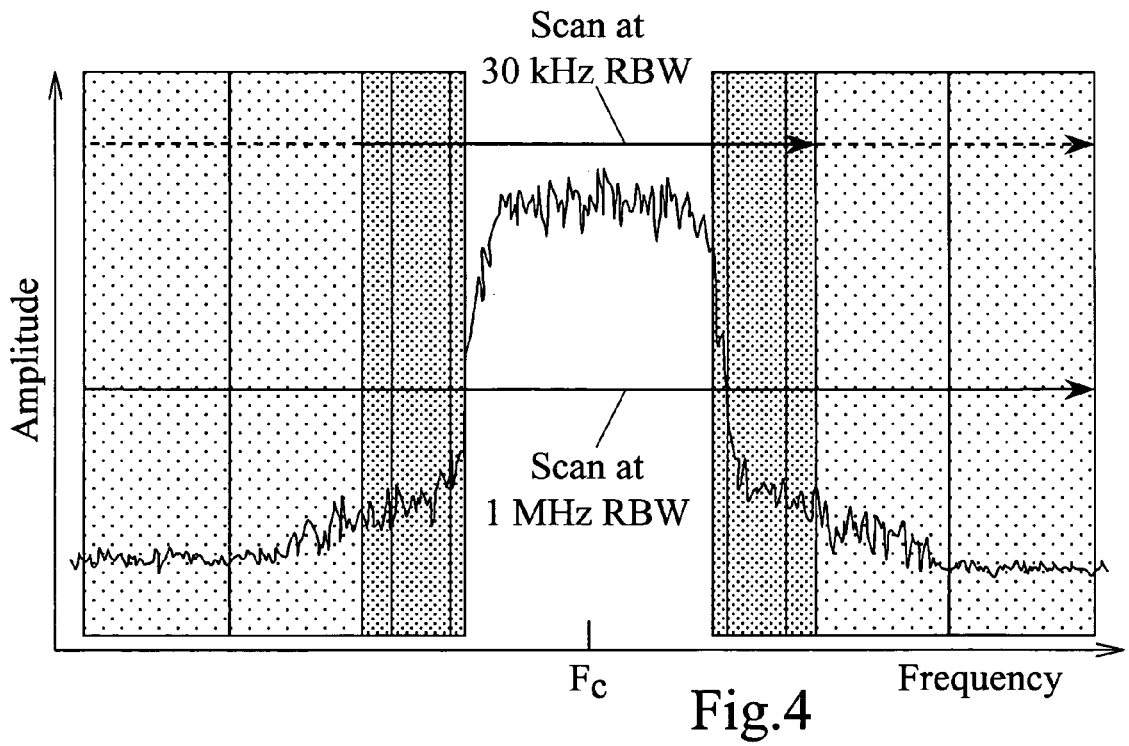
FIG. 4 is a frequency spectrum annotated to illustrate the implementation shown in FIG. 3.

Having determined the revised frequency sweep parameters, the procedure advances to step 26, where the analyser carries out a frequency sweep for each separate resolution bandwidth (in the present example there are two sweeps, one at 30 KHz RBW and one at 1 MHz, as shown in FIG. 4, so there is only a single setup delay between them).

Then at step 28 the final desired spectrum emission mask measurement is obtained, by assembling selected portions from each of the sweep measurements. As shown in FIGS. 5a to 5c, portions 30 and 32 are extracted from the frequency sweep at 1 MHz resolution bandwidth, for the frequency bands where measurement is required at that resolution bandwidth ($F_c-12.5\pm 0.5$ MHz→$F_c-4.0\pm 0.5$ MHz, and $F_c+4.0\pm 0.5$ MHz→$F_c+12.5\pm 0.5$ in the example discussed above). Likewise, portions 34 and 36 are extracted from the frequency sweep at 30 kHz resolution bandwidth, for the bands where measurement at the narrower resolution bandwidth is required ($F_c-3.985\pm 0.015$ MHz $F_c-2.515\pm 0.015$ MHz and $F_c+2.515\pm 0.015$ MHz→$F_c+3.985\pm 0.015$ MHz). As explained earlier, if different overall bandwidths have been used for the frequency sweeps at the different resolution bandwidths, then some of the extracted portions will need to be re-sized (in a manner in itself already known in the art).

The extracted portions are then combined, as shown in FIG. 5c, to produce the final spectrum emission mask measurement.

Figure 6:
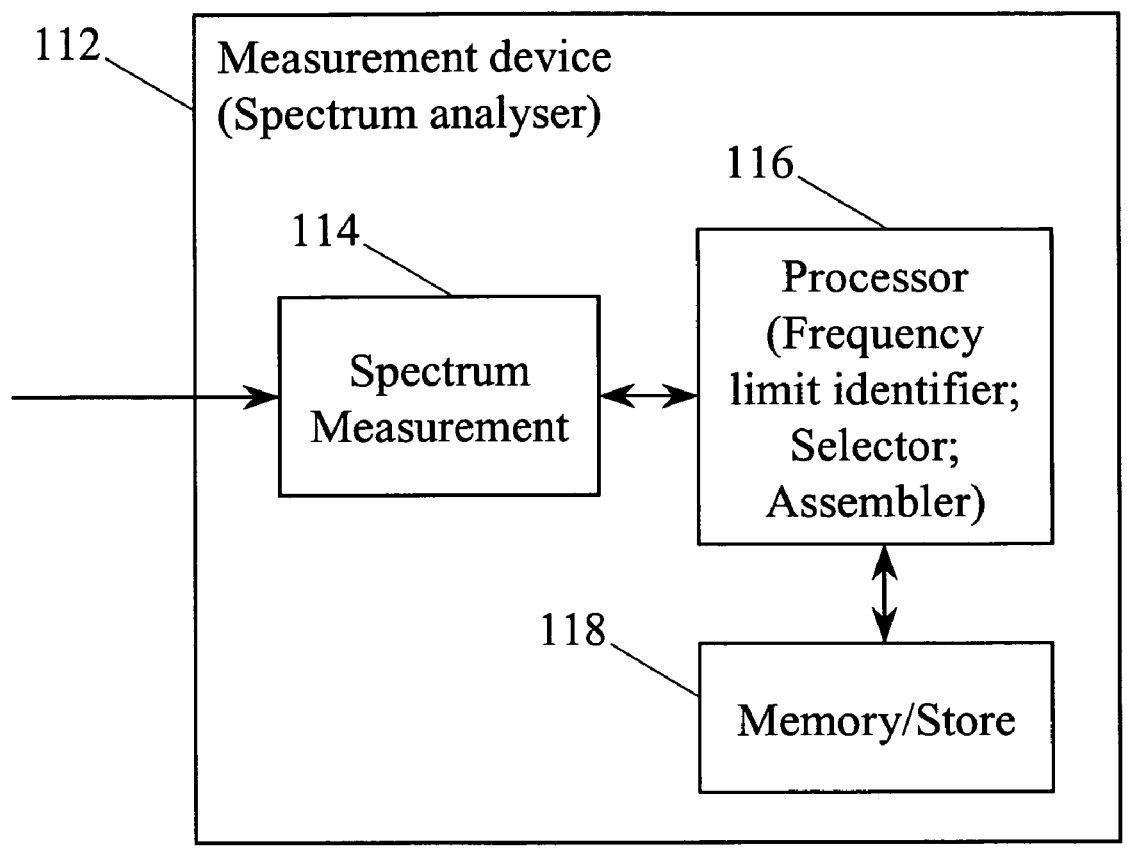
FIG. 6 is a block schematic diagram of a spectrum analyser in accordance with the invention.

FIG. 6 shows a spectrum analyser 112 for implementing the procedure of FIG. 3. Referring to FIG. 6, the spectrum analyser 112 includes a spectrum measurement circuit 114 that receives the signal from the unit under test and that operates under the control of a processor 116 associated with a memory 118 for storing the software program instructions and information such as the frequency bands for a required spectrum emission mask measurement. The processor 116 operates, under the control of the software program instructions, to provide functionality including identifying frequency limits for each measurement band, and selecting and assembling spectrum measurement portions into a complete spectrum measurement.

Although the invention has been described in the context of spectrum emission mask measurements, it is not confined to that use, but may also be used in any circumstances in which different frequency bands of a spectrum are to be measured at different resolution bandwidths.

The invention claimed is:

1. A method of measuring a signal spectrum in which signal power levels for different frequency bands in the signal spectrum are to be measured at different respective resolution bandwidths, comprising:
   identifying extreme start and stop frequencies for overall sections of the signal spectrum to be measured at each resolution bandwidth;
   performing a plurality of spectrum measurements, each said spectrum measurement extending between respective extreme start and stop frequencies for the respective resolution bandwidth of that spectrum measurement;
   selecting from each spectrum measurement, portions that correspond to frequency bands in the signal spectrum to be measured at the respective resolution bandwidth of that spectrum measurement; and
   assembling the selected spectrum measurement portions into a complete spectrum measurement.

2. The method of claim 1, wherein the frequency bands to be measured are grouped according to required resolution bandwidths and sorted into frequency order within each group.

3. The method of claim 1, wherein same start and stop frequencies are used for each spectrum measurement at a respective resolution bandwidth.

4. The method of claim 1, wherein different start and stop frequencies are used for different spectrum measurements at respective resolution bandwidths, and a selected portion of at least one spectrum measurement is resized for assembly into the complete spectrum measurement.

5. An apparatus for measuring a signal spectrum in which signal power levels for different frequency bands in the signal spectrum are to be measured at different respective resolution bandwidths, comprising:
   an identifier for identifying extreme start and stop frequencies for overall sections of the signal spectrum to be measured at each resolution bandwidth;
   a spectrum measurer for performing a plurality of spectrum measurements, each said spectrum measurement extending between respective extreme start and stop frequencies for the respective resolution bandwidth of that spectrum measurement;

a selector for selecting from each spectrum which measurement, portions that correspond to frequency bands in the signal spectrum to be measured at the respective resolution bandwidth of that spectrum measurement; and an assembler for assembling the selected spectrum measurement portions into a complete spectrum measurement.

* * * * *